(12) United States Patent
Cho et al.

(10) Patent No.: US 7,575,962 B2
(45) Date of Patent: Aug. 18, 2009

(54) FIN STRUCTURE AND METHOD OF MANUFACTURING FIN TRANSISTOR ADOPTING THE FIN STRUCTURE

(75) Inventors: Hans S. Cho, Yongin-si (KR); Young-soo Park, Yongin-si (KR); Wenxu Xianyu, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 105 days.

(21) Appl. No.: 11/826,420

(22) Filed: Jul. 16, 2007

(65) Prior Publication Data
US 2008/0038889 A1 Feb. 14, 2008

(30) Foreign Application Priority Data
Aug. 11, 2006 (KR) ...................... 10-2006-0076210

(51) Int. Cl.
*H01L 21/00* (2006.01)
*H01L 21/84* (2006.01)
(52) U.S. Cl. ..................... 438/149; 438/311; 438/753; 257/E21.17; 257/E21.32; 257/E21.245; 257/E21.304; 257/E21.229; 257/E21.347; 257/E21.411

(58) Field of Classification Search ............... 438/96, 438/149, 311, 482, 475, 680, 692, 706, 663, 438/486, 795, 753, 758, 781
See application file for complete search history.

(56) References Cited

U.S. PATENT DOCUMENTS

| | | | |
|---|---|---|---|
| 6,689,650 B2 * | 2/2004 | Gambino et al. | 438/157 |
| 6,815,738 B2 * | 11/2004 | Rim | 257/256 |
| 6,936,516 B1 * | 8/2005 | Goo et al. | 438/283 |
| 6,943,087 B1 * | 9/2005 | Xiang et al. | 438/311 |
| 6,949,421 B1 * | 9/2005 | Padmanabhan et al. | 438/156 |
| 7,078,299 B2 * | 7/2006 | Maszara et al. | 438/285 |
| 2005/0048727 A1 | 3/2005 | Maszara et al. | |

* cited by examiner

*Primary Examiner*—David Nhu
(74) *Attorney, Agent, or Firm*—Harness, Dickey & Pierce, P.L.C.

(57) ABSTRACT

Provided are a fin structure and a method of manufacturing a fin transistor adopting the fin structure. A plurality of mesa structures including sidewalls are formed on the substrate. A semiconductor layer is formed on the mesa structures. A capping layer is formed on the semiconductor layer. Thus, the semiconductor layer is protected by the capping layer and includes a portion which is to be formed as a fin structure. A portion of an upper portion of the capping layer is removed by planarizing, and thus a portion of the semiconductor layer on upper surfaces of the mesa structures is removed. As a result, fin structures are formed on sides of the mesa structures to be isolated from one another. Therefore, a fin structure having a very narrow width can be formed, and a thickness and a location of the fin structure can be easily controlled.

23 Claims, 8 Drawing Sheets

FIN STRUCTURE AND METHOD OF MANUFACTURING FIN TRANSISTOR ADOPTING THE FIN STRUCTURE

CROSS-REFERENCE TO RELATED PATENT APPLICATION

This application claims the benefit of Korean Patent Application No. 10-2006-0076210, filed on Aug. 11, 2006, in the Korean Intellectual Property Office, the disclosure of which is incorporated herein in its entirety by reference.

BACKGROUND OF THE INVENTION

1. Field of the Invention

The present invention relates to a method of manufacturing a fin structure, and more particularly, to a method of manufacturing a fin transistor used in a semiconductor memory device.

2. Description of the Related Art

Fin transistors are suitable for design rule of 100 nm or less. In particular, fin transistors have been researched as low-powered, high-efficient, and high-speed devices. Active regions having extremely line widths of 20 nm or less are required to obtain full depletions of the fin transistors. In order to obtain fin transistors satisfying this requirement, it is very important to manufacture fin structures that are active regions.

Conventionally, a sidewall technique, ultraviolet lithography, electron beam lithography, etc. are sued to form fin structures. There is known a method of forming a polycrystal silicon fin structure on a silicon substrate using the sidewall technique. U.S. Patent Application Publication No. 2005-0048727 discloses a method of manufacturing a fin transistor using a sidewall crystal growth. In these conventional methods, with a narrow line width, uniformity of a fin structure is lowered, and it is costly to manufacture the fin structure.

SUMMARY OF THE INVENTION

The present invention provides a method of uniformly forming an inexpensive, highly reliable fin structure and a method of manufacturing a fin transistor adopting the fin structure.

According to an aspect of the present invention, there is provided a method of manufacturing fin structures on a substrate, including: forming a plurality of mesa structures including sidewalls corresponding to the fin structures on the substrate; depositing an amorphous semiconductor material on the mesa structures to form an amorphous semiconductor layer including a portion directly formed on a surface of the substrate and a portion formed on the sidewalls of the mesa structures; forming a capping layer on the amorphous semiconductor layer; removing portions of the capping layer and the amorphous semiconductor layer on upper surfaces of the mesa structures in the resultant stack structure formed on the substrate; and removing the mesa structures and the capping layer to predetermined depths to obtain the fin structures including lower portions supported by remaining portions of the mesa structures and the capping layer.

According to another aspect of the present invention, there is provided a method of manufacturing a fin transistor including active regions that are fin structures, including: forming a plurality of mesa structures including sidewalls corresponding to the fin structures on a substrate; depositing an amorphous semiconductor material on the mesa structures to form an amorphous semiconductor layer including a portion directly formed on a surface of the substrate and a portion formed on the sidewalls of the mesa structures; forming a capping layer on the amorphous semiconductor layer; removing portions of the capping layer and the amorphous semiconductor layer on upper surfaces of the mesa structures in the resultant stack structure formed on the substrate; and removing the mesa structures and the capping layer to predetermined depths to obtain the fin structures comprising lower portions supported by remaining portions of the mesa structures and the capping layer.

After the capping layer is formed on the amorphous semiconductor layer, the method may further include crystallizing the amorphous semiconductor layer using a crystallization process comprising annealing. According to an aspect of the present invention, the crystallization of the fin structures may be performed after the fin structures are obtained. The fin structures may be crystallized using SPE or liquid phase epitaxy. If the SPE is applied, the substrate may be a crystalline substrate. If the liquid phase epitaxy is applied, a crystalline nucleus is not required. Thus, the substrate may be an amorphous substrate. The SPE may be performed using eximer laser annealing (ELA). In this case, when the fin structures are melted to be spherical, the crystallization may be induced.

The amorphous semiconductor layer may be formed of silicon. The substrate may be a silicon wafer.

The mesa structures and the capping layer may be formed of the same material, preferably, silicon oxide.

After the mesa structures are formed, the method may further include removing oxide on the surface of the substrate. After the amorphous semiconductor layer is formed, the method may further include injecting ions into the amorphous semiconductor layer. The amorphous semiconductor layer and the ions may be formed of the same material. The method may further include injecting silicon ions into the amorphous semiconductor layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A method of manufacturing a fin structure according to the present invention will now be described with reference to the attached drawings. The method corresponds to a method of manufacturing a fin type active region of a fin transistor. Therefore, a method of manufacturing a fin transistor according to the present invention will be easily understood according to the method.

FIGS. 1 through 6 are cross-sectional views illustrating processes of manufacturing a fin structure according to an embodiment of the present invention. In embodiments of the present invention, silicon will be described as an application of a material of which a semiconductor layer is formed.

Figure 1:
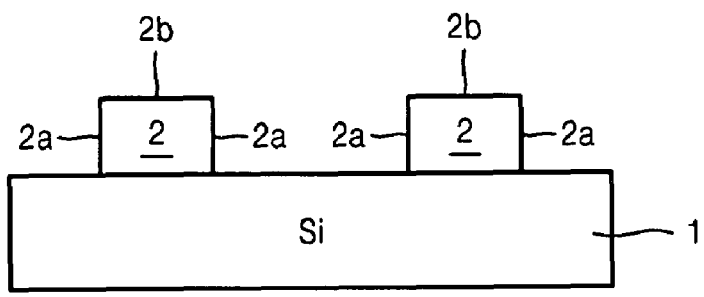
FIGS. 1 through 6 are cross-sectional views illustrating processes of manufacturing a fin structure according to an embodiment of the present invention.

As shown in FIG. 1, a plurality of mesa structures 2 having predetermined lengths are formed on a silicon substrate 1. The mesa structures 2 have upper surfaces 2b and sides 2a formed besides the upper surfaces 2b. A distance between the mesa structures 2 must be appropriately adjusted according to a distance between two neighboring thin film transistors.

Figure 2:
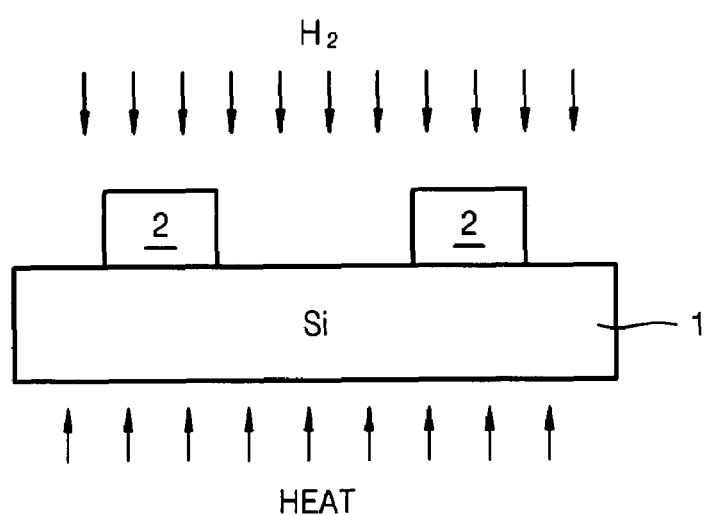

Referring to FIG. 2, the silicon substrate 1 is heated under an ultra high vacuum atmosphere with the supply of $H_2$ to remove a natural oxide remaining on a surface of the silicon substrate 1 using a reduction reaction. This process is selectively adopted in the method of manufacturing the fin structure according to the present invention. This process may improve an interface characteristic between an amorphous silicon layer to be formed under an ultra high vacuum atmosphere in a subsequent process and a substrate so as to assist silicon to be crystallized.

Figure 3:
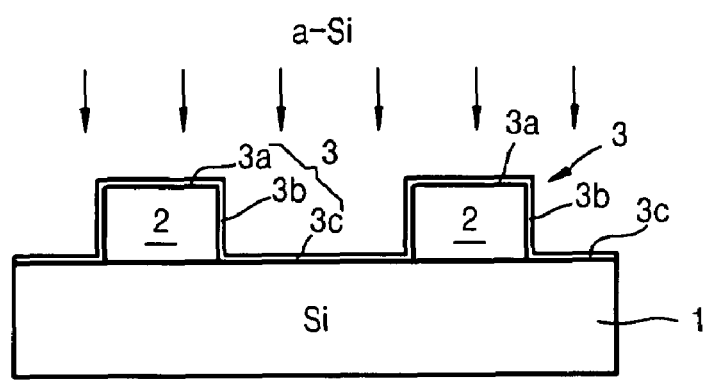

As shown in FIG. 3, an amorphous silicon layer 3 is formed as a semiconductor layer on the silicon substrate 1. The amorphous silicon layer 3 may be formed using ultra high voltage-chemical vapor deposition (UHV-CVD) so as to obtain a high-quality good interface characteristic between a high-quality substrate for solid phase epitaxy (SPE) and amorphous silicon. The amorphous silicon layer 3 is formed on the upper surfaces 2b and the sides 2a of the mesa structures 2 and an exposed portion of the surface of the silicon substrate 1. Thus, the amorphous silicon layer 3 includes first portions 3a formed on the upper surfaces 2b of the mesa structures 2, second portions 3b formed on the sides 2b of the mesa structures 2, and third portions 3c formed on the silicon substrate 1. The third portions 3c of the amorphous silicon layers 3 contact the silicon substrate 1, and crystal growth starts from the third portions 3c. The second portions 3b correspond to fin structures to be crystallized and then used as active regions of a transistor.

Figure 4:
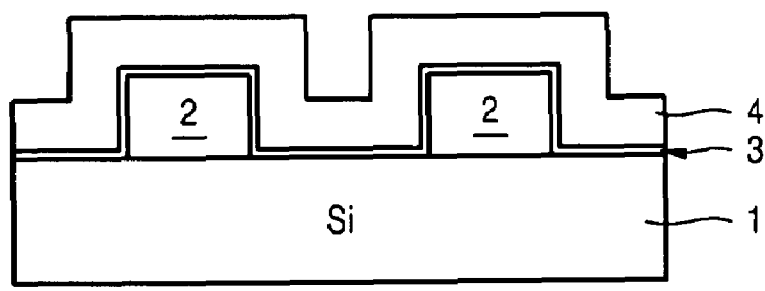

As shown in FIG. 4, a capping layer 4 is formed on the amorphous silicon layer 3 so as to bury the amorphous silicon layer 3. The capping layer 4 may be formed to a thickness enough to fully fill areas between the mesa structures 2. In particular, the thickness of the capping layer 4 is adjusted according to heights of fin structures to be formed later. The capping layer 4 may be formed of the same material as that of which the mesa structures 2 are formed, e.g., $SiO_2$.

Figure 5:
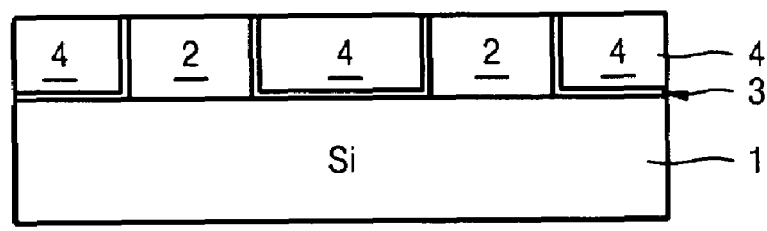

As shown in FIG. 5, materials stacked on the silicon substrate 1 are polished or etched starting from the top of the materials using a planarization process in order to remove the first portions 3a of the amorphous silicon layer 3 formed on the upper surfaces 2b of the mesa structures 2. This is to isolate the second portions 3b formed on the sides 2a of the mesa structures 2 as independent fin structures from one another. The planarization process is achieved by removing an upper portion of the materials stacked on the silicon substrate 1 to a predetermined thickness. For example, the planarization process may be performed using chemical mechanical polishing (CMP) or non-selective dry etching.

Figure 6:
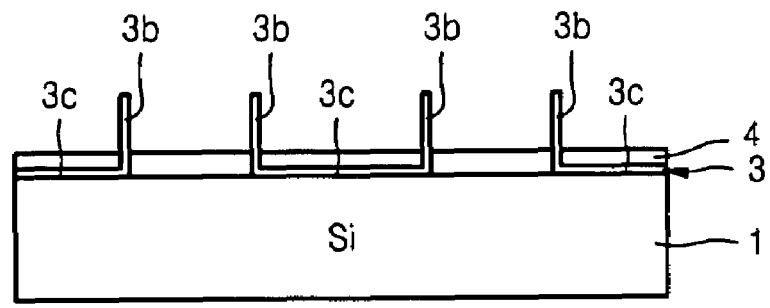

As shown in FIG. 6, fin structures having predetermined heights are obtained form the second portions 3b of the amorphous silicon layer 3, and then the mesa structures 2 and the capping layer 3 burying the fin structures are removed to a predetermined depth. As a result, portions of the mesa structures 2 and the capping layer 3 remain so as to support lower portions of the second portions 3b (hereinafter referred to as fin structures) of the amorphous silicon layer 3. Next, the fin structures 3b are crystallized using well-known SPE including a thermal treatment such as rapid thermal annealing (RTA) or the like. The crystallization of the fin structures 3b is performed from portions of the fin structures 3b contacting the silicon substrate 1 having single crystallinity. Thus, the fin structures 3b and the silicon substrate 1 are crystallized into one body.

If a target single crystal silicon fin structure is obtained through such processes, a fin transistor is obtained using a subsequent well-known method.

According to an aspect of the present invention, the crystallization may be performed before the fin structures 3b are obtained. For example, a crystallization of an amorphous silicon layer using SPE may be performed after the process described with reference to FIG. 5 or immediately after the process described with reference to FIG. 5. In other words, according to an aspect of the present invention, the crystallization of amorphous silicon may be performed in any step after the capping layer 4 covering the amorphous silicon is formed.

Figure 7:
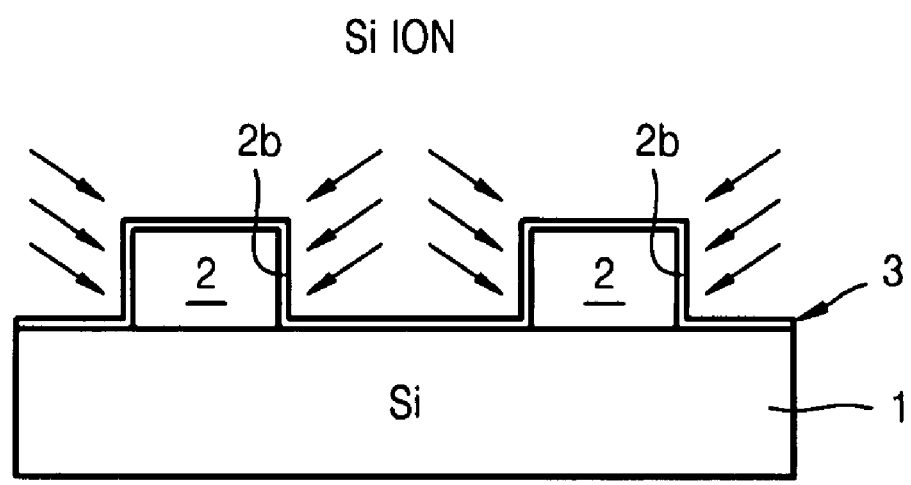
FIG. 7 is a cross-sectional view illustrating a process of injecting ions into a semiconductor layer according to an embodiment of the present invention.

In order to obtain a high-quality single crystal silicon fin structure, seeds of polycrystal silicon, etc. remaining in the amorphous silicon layer 3 are required to be removed before the amorphous silicon layer 3 is crystallized. For this purpose, silicon ions are injected into the amorphous silicon layer 3 as shown in FIG. 7 after the amorphous silicon layer 3 is formed. The silicon ions clash against the amorphous silicon layer 3 having high energy and thus destroy crystalline silicon domains of the amorphous silicon layer 3 so as to make amorphous silicon further uniform. As a result, the silicon ions prevent the amorphous silicon layer 3 from being crystallized by a non-specific silicon seed existing in the amorphous silicon layer 3 and allow the crystallization of the amorphous silicon layer 3 to start from only the portions of the amorphous silicon layer 3 contacting the silicon substrate 1. The silicon ions are injected into the silicon substrate 1 in a direction slanting toward the silicon substrate 1 so as to fully clash against sidewalls of the mesa structures 2.

Figure 8A:
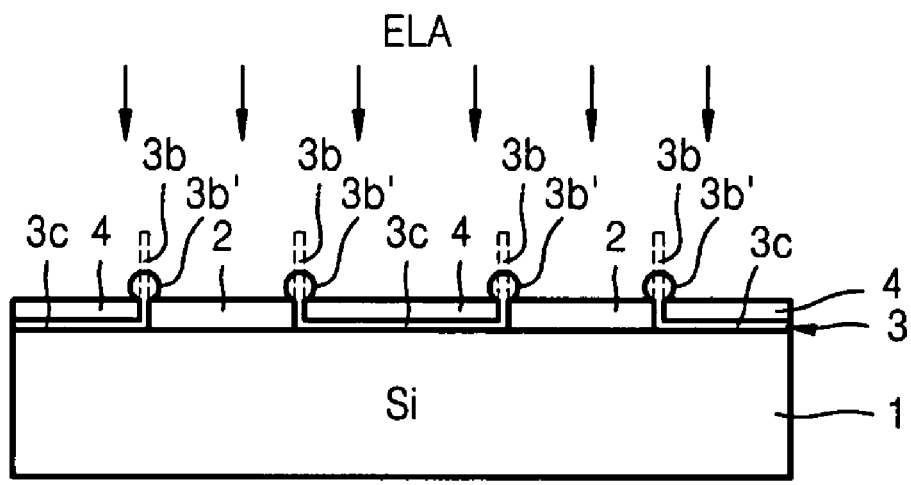
FIGS. 8A and 8B are a cross-sectional view and a plan view illustrating a method of crystallizing fin structures according to an embodiment of the present invention.
Figure 8B:
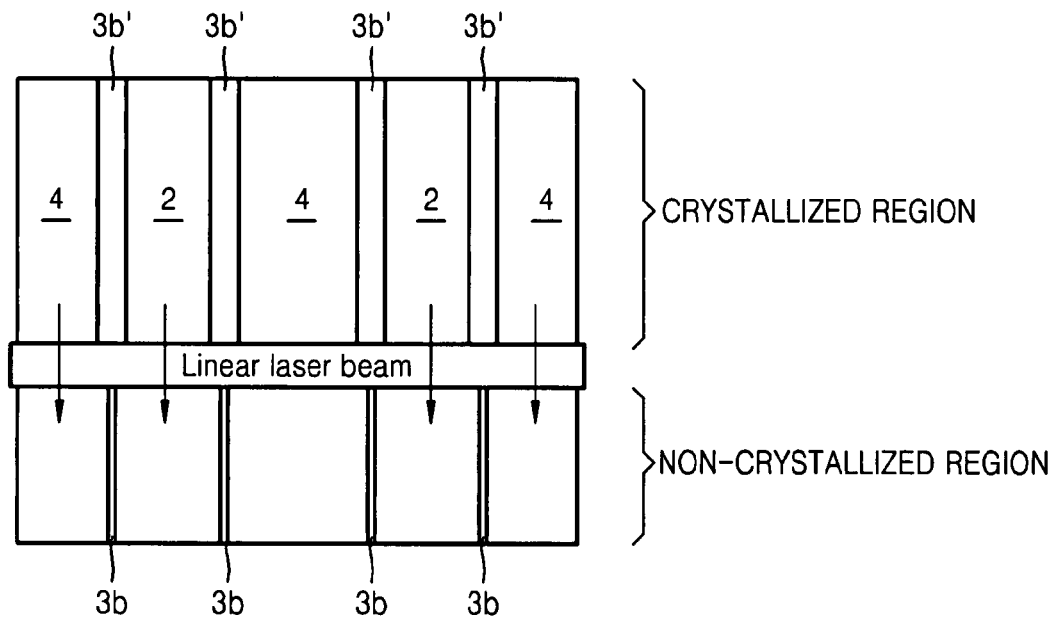

FIGS. 8A and 8B are a cross-sectional view and a plan view illustrating a method of crystallizing the fin structures 3b of FIG. 6 into spherical structures 3b' using liquid phase epitaxy, according to an embodiment of the present invention. Here, the spherical structures 3b' are modifications of the fin structures and thus regarded as one type of fin structures.

Referring to FIG. 8A, the fin structures 3b are melted and solidified using eximer laser annealing (ELA). Thus, the fin structures 3b are crystallized into the spherical structures 3b'. As a result, if the silicon substrate 1 is formed of a crystalline material, single crystal fin structures may be obtained. If the silicon substrate 1 is formed of an amorphous material, polycrystal silicon fin structures may be obtained.

FIG. 8B is a plan view illustrating the method of using the ELA described with reference to FIG. 8A. Referring to FIG. 8B, linear laser beams advance in one direction, i.e., from an upper direction toward a downward direction, to melt and solidify the fin structures 3b so as to crystallize the fin structures 3b into the spherical structures 3b'.

Figure 9:
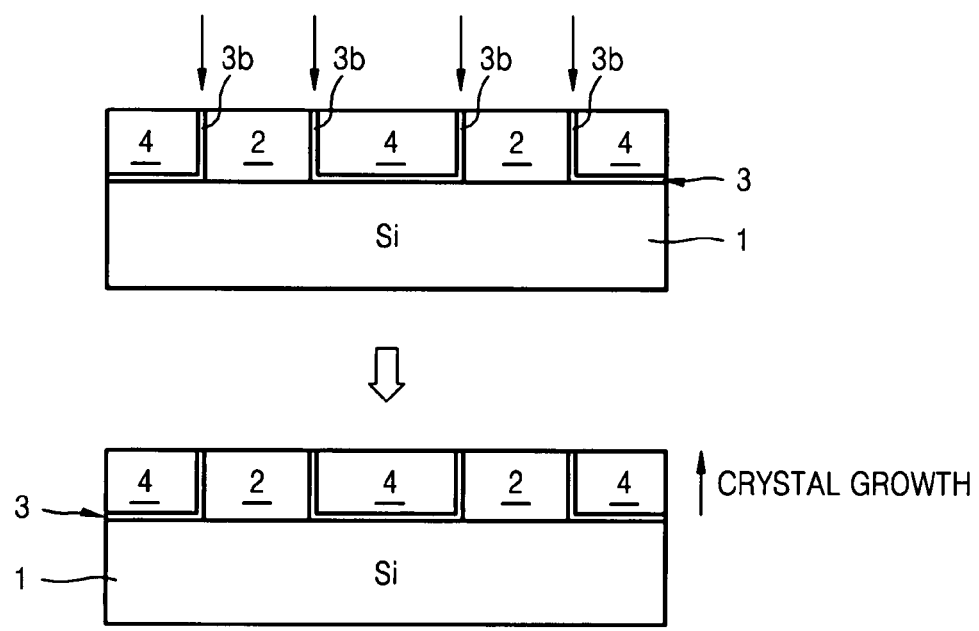
FIG. 9 is a cross-sectional view illustrating a method of crystallizing fin structures according to anther embodiment of the present invention.

FIG. 9 is a cross-sectional view illustrating a method of forming a crystalline or polycrystal fin structures using melting and solidifying using ELA. The method is performed after the planarization process described with reference to FIG. 5 in the previous embodiment is performed Eximer laser beams are irradiated onto the fin structures 3b of which front ends are exposed by planarization, to melt the fin structures 3b. Thereafter, the eximer laser beams are removed to solidify the fin structures 3b so as to crystallize the fin structures 3b. Portions of melted silicon contacting the silicon substrate 1 are first solidified. Thus, crystals are grown from lower portions of the fin structures 3b toward an upward direction.

If the silicon substrate 1 is formed of an amorphous material such as glass or plastic, the fin structures 3b may be formed of polycrystal silicon.

Figure 10A:
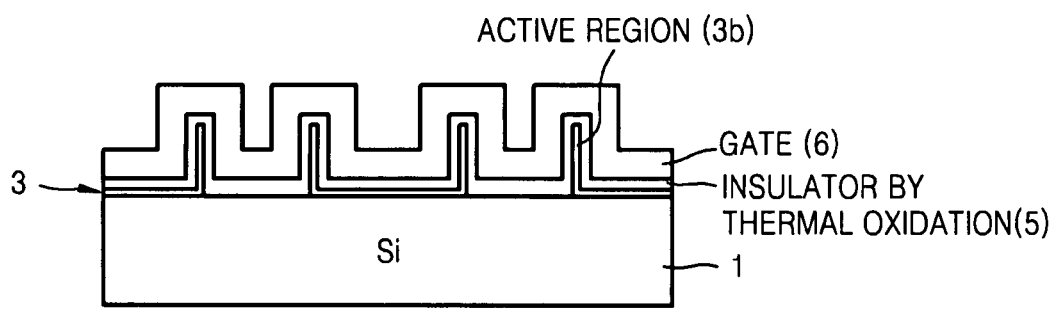
FIGS. 10A and 10B are schematic cross-sectional views of a fin transistor according to an embodiment of the present invention.
Figure 10B:
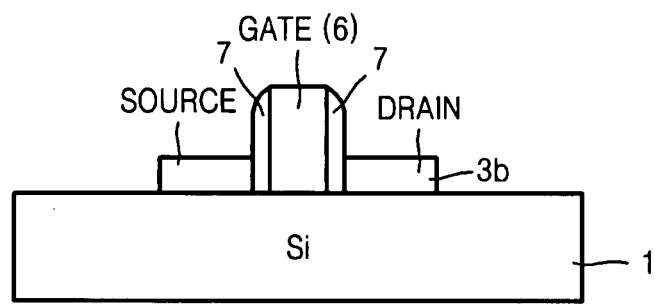

FIGS. 10A and 10B are schematic cross-sectional views of a fin transistor according to an embodiment of the present invention.

Referring to FIG. 10A, a gate insulator 5 is formed on the fin structures 3b that are active regions. The gate insulator 5 is obtained by thermal oxidation of the silicon substrate 1 and the fin structures 3b. A gate 6 is formed on the gate insulator 5. As shown in FIG. 10B, the gate 6 is positioned in an intermediate portion of the fin structure 3b, and both sides of the fin structure 3b are used as a source and a drain. Sidewalls 7 are formed on both sides of the gate 6 to electrically insulate the source and the drain from each other. The fin transistor having this structure is manufactured using processes: completing the fin structures 3b; forming the gate insulator 5 using thermal oxidation using a well-known method; depositing a gate material on the gate insulator 5; patterning the gate 6; and forming the sidewalls 7.

A multilayer structure may be manufactured according to fin structures and a method of manufacturing a fin transistor using the fin structures as described above.

Fin structures as described above may be formed on a fin transistor obtained through processes as described above.

FIGS. 11 through 15 are schematic cross-sectional views illustrating a method of manufacturing fin transistors having dual layer structures according to an embodiment of the present invention.

Figure 11:
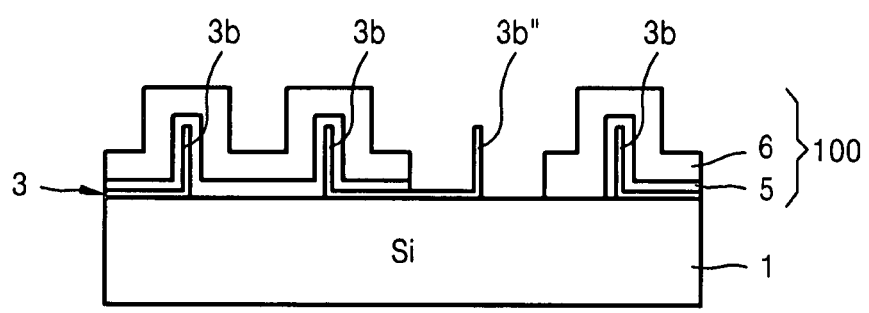
FIGS. 11 through 15 are schematic cross-sectional views illustrating a method of manufacturing a fin transistor having a dual layer structure according to an embodiment of the present invention.

As shown in FIG. 11, thin film transistors (TFTs) having a single layer structure are manufactured using the fin structures 3b obtained using the above-described processes. Here, a fin structure 3b" is used for forming a new silicon seed layer that will be described later not for manufacturing the TFTs. The TFTs shown in FIG. 11 have the same structures the fin transistor shown in FIG. 10A, and thus like reference numerals denote like elements.

Figure 12:
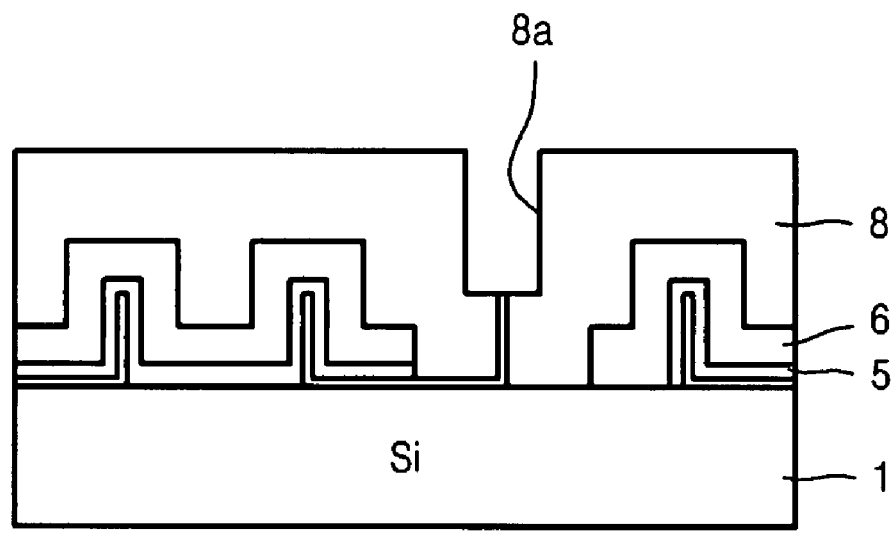

As shown in FIG. 12, a passivation layer 8 is formed on the TFTs, and a well 8a corresponding to the fin structure 3b" used for forming the new silicon seed layer is formed in the passivation layer 8.

Figure 13:
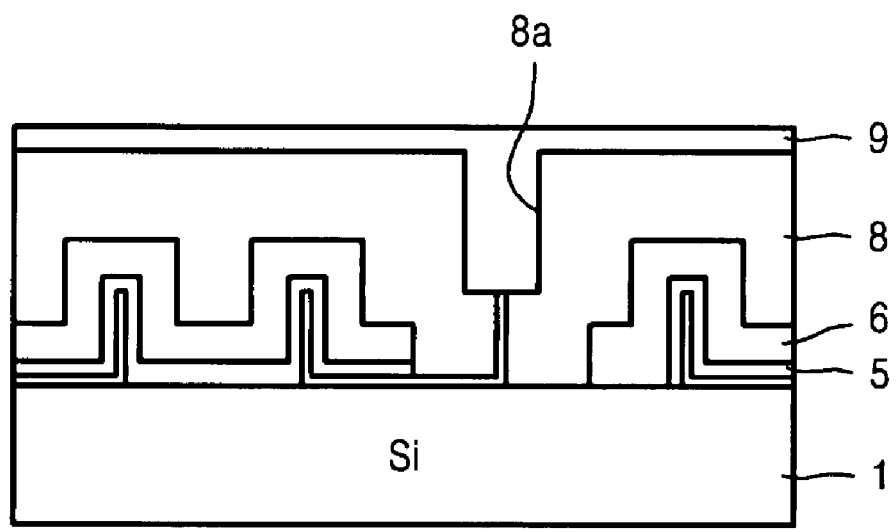

As shown in FIG. 13, amorphous silicon is deposited on the passivation layer 8 to form a seed layer 9 in an amorphous state.

Figure 14:
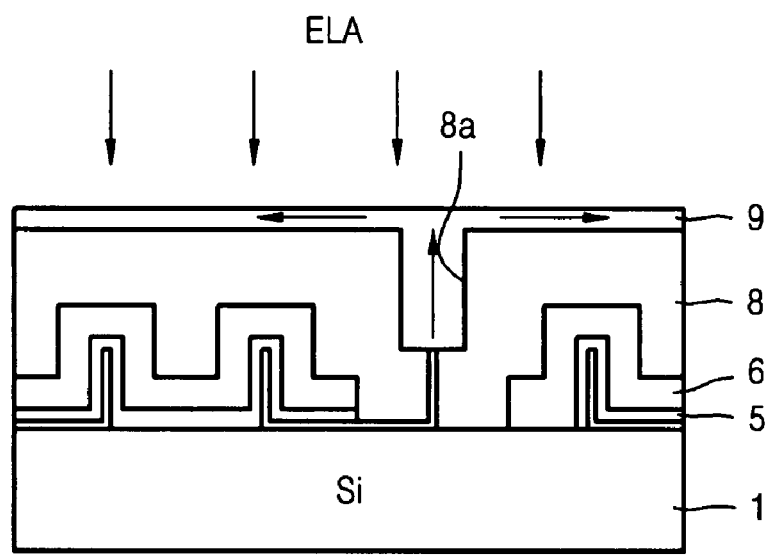

As shown in FIG. 14, the seed layer 9 is crystallized using ELA or the like. The crystallization of the seed layer 9 starts from a portion of a bottom of the well 8a contacting the fin structure 3b". Thus, a crystal growth is performed in a vertical direction inside the well 8a as marked with arrows and in a horizontal direction above the passivation layer 8.

Figure 15:
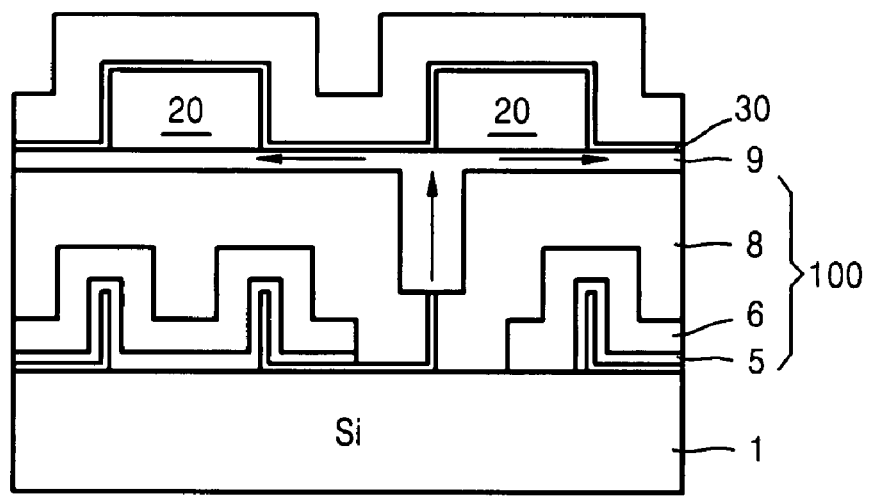

As shown in FIG. 15, mesa structures 20 are formed on the seed layer 9 to manufacture new fin structures, and an amorphous silicon layer 30 is deposited on the mesa structures 20. Thereafter, fin structures having dual layer structures are obtained using the processes previously described with reference to FIGS. 4 through 6, and TFTs having dual layer structures are manufactured using the fin structures.

Figure 16:
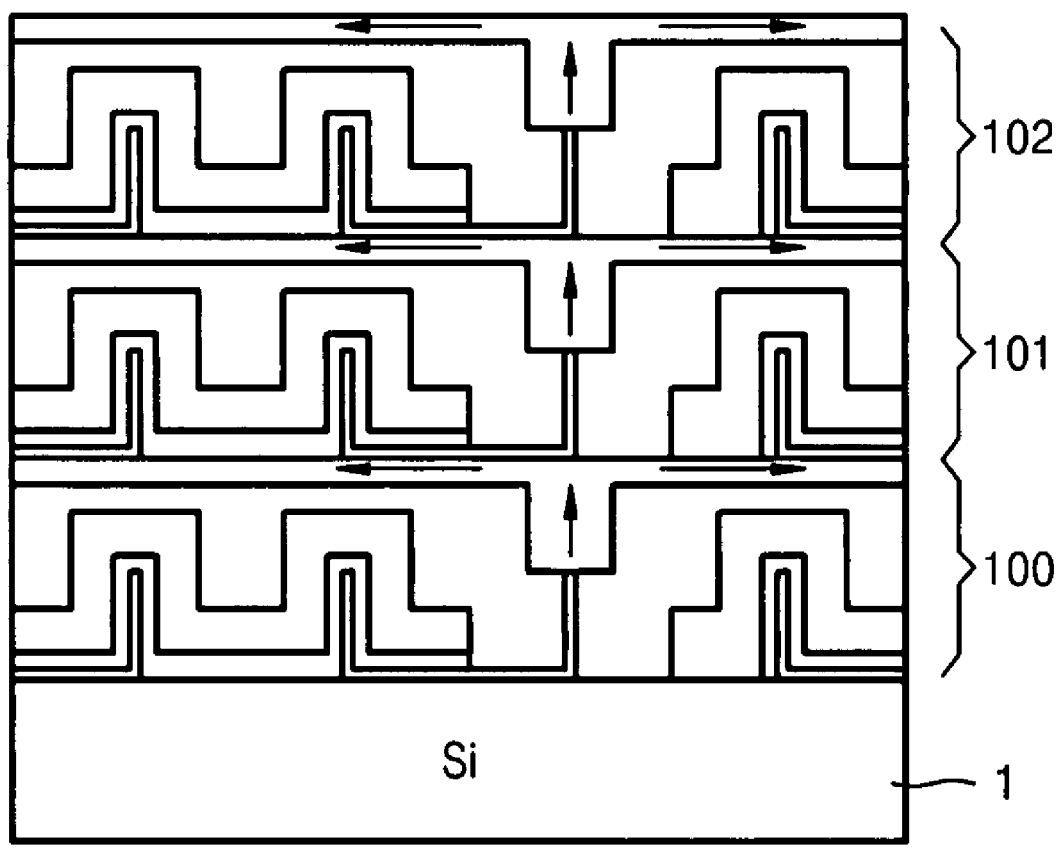
FIG. 16 is a cross-sectional view illustrating a fin transistor having a triple layer structure according to an embodiment of the present invention.

FIG. 16 is a cross-sectional view illustrating TFTs 100, 101, and 102 having triple layer structures. Here, the TFTs 100, 101, and 102 may be obtained using the above-described method.

As described above, according to the present invention, a width of a fin structure can be determined depending on a deposition thickness of the fin structure. Thus, a fin structure having an extremely narrow width of 10 nm or less can be manufactured. The fin structure can be crystallized on a silicon substrate using SPE so as to have a complete single crystal structure. The fin structure does not depend on photolithography and thus can be manufactured at low cost. In particular, since a capping layer can be used to manufacture the fin structure, the fin structure is not deformed in a CMP process in which a physical force is applied. As a result, a thickness and a location of the fin structure can be easily controlled.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing fin structures on a substrate, comprising:
   forming a plurality of mesa structures including sidewalls;
   depositing an amorphous semiconductor material on the plurality of mesa structures to form an amorphous semiconductor layer including a portion on a surface of the substrate and a portion on sidewalls of the plurality of mesa structures;
   forming a capping layer on the amorphous semiconductor layer;
   removing portions of the capping layer and the amorphous semiconductor layer on upper surfaces of the plurality of mesa structures; and
   removing at least an upper portion of each of the plurality of mesa structures and at least an upper portion of the capping layer to obtain the fin structures including lower portions supported by remaining portions of the plurality of mesa structures and the remaining portions of the capping layer.

2. The method of manufacturing fin structures on a substrate according to claim 1, further comprising:
   after forming the amorphous semiconductor layer, crystallizing the amorphous semiconductor layer using a crystallization process including annealing.

3. The method of manufacturing fin structures on a substrate according to claim 1, further comprising:
   crystallizing the fin structures using a crystallization process including annealing.

4. The method of manufacturing fin structures on a substrate according to claim 3, wherein the fin structures are crystallized using one of solid phase epitaxy (SPE) and liquid phase epitaxy.

5. The method of manufacturing fin structures on a substrate according to claim 1, wherein the substrate is a crystalline substrate.

6. The method of manufacturing fin structures on a substrate according to claim 5, wherein the substrate and the amorphous semiconductor layer are formed of silicon.

7. The method of manufacturing fin structures on a substrate according to claim 1, wherein the plurality of mesa structures and the capping layer are formed of silicon oxide.

8. The method of manufacturing fin structures on a substrate according to claim 1, further comprising:
   after forming the plurality of mesa structures, removing oxide on the surface of the substrate.

9. The method of manufacturing fin structures on a substrate according to claim 1, further comprising:
   after forming the amorphous semiconductor layer, injecting ions into the amorphous semiconductor layer.

10. The method of manufacturing fin structures on a substrate according to claim 9, wherein the amorphous semiconductor layer is a silicon semiconductor layer, and the ions are silicon ions.

11. The method of manufacturing fin structures on a substrate according to claim 9, wherein the fin structures are fin structures of a first layer of fin transistors.

12. The method of manufacturing fin structures on a substrate according to claim 11, further comprising:
   forming a first gate insulator on the fin structures, the remaining portions of the plurality of mesa structures, and the remaining portions of the capping layer.

13. The method of manufacturing fin structures on a substrate according to claim 12, further comprising:
   forming a first gate layer on the first gate insulator.

14. The method of manufacturing fin structures on a substrate according to claim 13, further comprising:
   patterning the first gate layer to form the first layer of fin transistors.

15. The method of manufacturing fin structures on a substrate according to claim 14, further comprising:
   depositing a first passivation layer to form a first groups of wells.

16. The method of manufacturing fin structures on a substrate according to claim 15, further comprising:
   depositing a first amorphous semiconductor material on the passivation layer to fill the first groups of wells; and
   crystallizing the first amorphous semiconductor layer using a crystallization process including annealing.

17. The method of manufacturing fin structures on a substrate according to claim 16, further comprising:
   repeating the forming of a plurality of mesa structures, the depositing of an amorphous semiconductor material, the forming of a capping layer, the removing of portions of the capping layer and the amorphous semiconductor layer, and the removing of at least an upper portion of each of the plurality of mesa structures and at least an upper portion of the capping layer to obtain fin structures of a second layer of fin transistors.

18. The method of manufacturing fin structures on a substrate according to claim 17, further comprising:
   forming a second gate insulator on the fin structures of the second layer of fin transistors, the remaining portions of the plurality of mesa structures, and the remaining portions of the capping layer.

19. The method of manufacturing fin structures on a substrate according to claim 18, further comprising:
   forming a second gate layer on the second gate insulator.

20. The method of manufacturing fin structures on a substrate according to claim 19, further comprising:
   patterning the second gate layer to form the second layer of fin transistors.

21. The method of manufacturing fin structures on a substrate according to claim 20, further comprising:
   depositing a second passivation layer to form a second group of wells.

22. The method of manufacturing fin structures on a substrate according to claim 21, further comprising:
   depositing a second amorphous semiconductor material on the second passivation layer to fill the second group of wells; and
   crystallizing the second amorphous semiconductor layer using a crystallization process including annealing.

23. The method of manufacturing fin structures on a substrate according to claim 22, further comprising:
   repeating the forming of a plurality of mesa structures, the depositing of an amorphous semiconductor material, the forming of a capping layer, the removing of portions of the capping layer and the amorphous semiconductor layer, and the removing of at least an upper portion of each of the plurality of mesa structures and at least an upper portion of the capping layer to obtain fin structures of a third layer of fin transistors.

\* \* \* \* \*